United States Patent [19]

Norberg

[11] 4,025,803

[45] May 24, 1977

[54] MULTI-LEVEL CLIPPING CIRCUIT

[75] Inventor: Gayle Russell Norberg, Columbia Heights, Minn.

[73] Assignee: Control Data Corporation, Minneapolis, Minn.

[22] Filed: Mar. 1, 1976

[21] Appl. No.: 662,314

[52] U.S. Cl. .............................. 307/237; 307/304; 307/318; 328/171; 328/31; 323/9
[51] Int. Cl.² .......................................... H03K 5/08
[58] Field of Search ................... 307/237, 318, 304; 328/171, 172, 168, 169, 62, 31, 32, 54; 324/77 A; 323/9

[56] References Cited

UNITED STATES PATENTS

| | | | |
|---|---|---|---|
| 3,553,487 | 1/1971 | Freeborn | 307/235 P |
| 3,555,305 | 1/1971 | Luczkowski | 307/235 P |
| 3,611,162 | 10/1971 | Tochitani | 307/235 N |
| 3,670,180 | 6/1972 | Grossimon et al. | 328/75 |

Primary Examiner—Stanley D. Miller, Jr.
Attorney, Agent, or Firm—Edward L. Schwarz

[57] ABSTRACT

A circuit receiving a varying waveform and providing a plurality of signals, each signal changing when the waveform crosses a predetermined voltage level associated with that signal.

16 Claims, 2 Drawing Figures

MULTI-LEVEL CLIPPING CIRCUIT

BACKGROUND OF THE INVENTION

1. Field of the Invention

In devices such as that described in U.S. patent applications entitled "Power Brown-Out Detector" and "Line Power Distortion Detector," having a common inventor, assignee and filing date with this patent application, and in certain data signal analyzers, it is necessary to supply output signals whose values change when the waveform under analysis by such equipment crosses preselected voltage crossover levels, each level being associated with a particular output signal. For such devices, it is preferred that each output have a first value when the input signal excursion from zero is less than the associated voltage level, and a second value when the associated input signal excursion is at least equal to the preselected voltage level. This permits simplified processing by such monitor and analysis devices.

2. Description of the Prior Art

U.S. Pat. Nos. 3,916,293 (Omori, et al.) and 3,525,879 (Barbay) contain the closest art of which the inventor is aware. Both disclose clipping circuits. However, neither performs DC restoration, as does the invention. Also, several DC power levels are required, whereas the instant invention requires only one.

BRIEF DESCRIPTION OF THE INVENTION

The input signal to be monitored is assumed to be available as a varying signal on first and second signal terminals. The heart of the invention comprises a plurality of zener diodes or other breakdown devices connected in a series string, each having a preselected voltage drop from a first to a second terminal. If zener diodes are used, all must have the same orientation in the string, anode of one to cathode of the next, so as to create additive backward voltage drops along the string. If four-layer type breakdown diodes or gas-filled tubes are used as the breakdown devices to form the string, orientation may of course be immaterial. One signal terminal is connected to an end terminal on a first end of the string so that current flow will be in the direction having a breakdown voltage drop in each device. An AC input signal can be practically used only with symmetrical devices. The input to non-symmetrical devices such as zeners should be first rectified to prevent spurious signals caused by their forward biassing. To accomplish this, a transformer type full-wave rectifier is often preferred for reasons to be explained below.

The breakdown device voltage drops are chosen such that the sum of drops between the first end of the device string and the other end of the device string, or the connection between any two breakdown devices, is substantially equal to a desired voltage crossover level, taking into account voltage step up or step down and diode drops in the rectifier. Each connector between a pair of breakdown devices, and the end device electrode at the second end of the diode string opposite the first end, are all resistively connected by return path resistors to the second signal terminal. The voltage across each return path resistor is 0 until the voltage between signal terminals exceeds the sum of the preselected voltage drops between the first end of the string and the resistor involved, whereupon the resistor voltage follows the input signal wave, reduced by the summed voltage drops involved. An amplifier squares up each of these resistor voltages to produce logic level signals suitable for processing by the aforementioned analysis circuits. Each signal changes level at precisely the time the signal wave crosses the respective voltage level.

Accordingly, one object of this invention is to provide a logic level output signal changing value whenever a signal voltage crosses a predetermined voltage level.

Another object is to provide these output signals with a circuit employing breakdown diodes having the smallest possible total reverse voltage drop.

Another object is to provide these aforementioned signals for both positive and negative half cycles of the signal waveform.

Yet another object is to employ the smallest number of electronic components possible in the circuit providing these signals.

DESCRIPTION OF THE PREFERRED EMBODIMENTS

Figure 1:
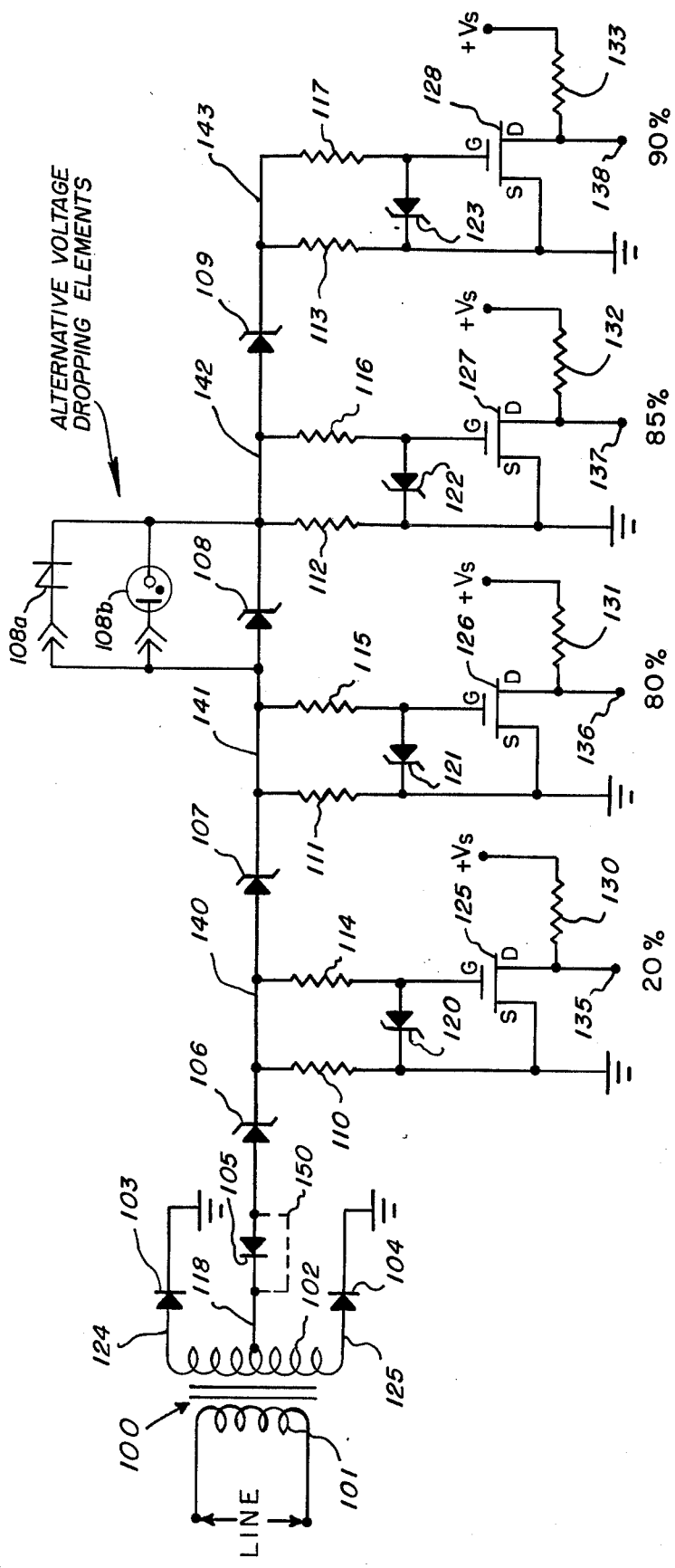
FIG. 1 discloses a preferred embodiment of the circuit of the invention.
Figure 2:
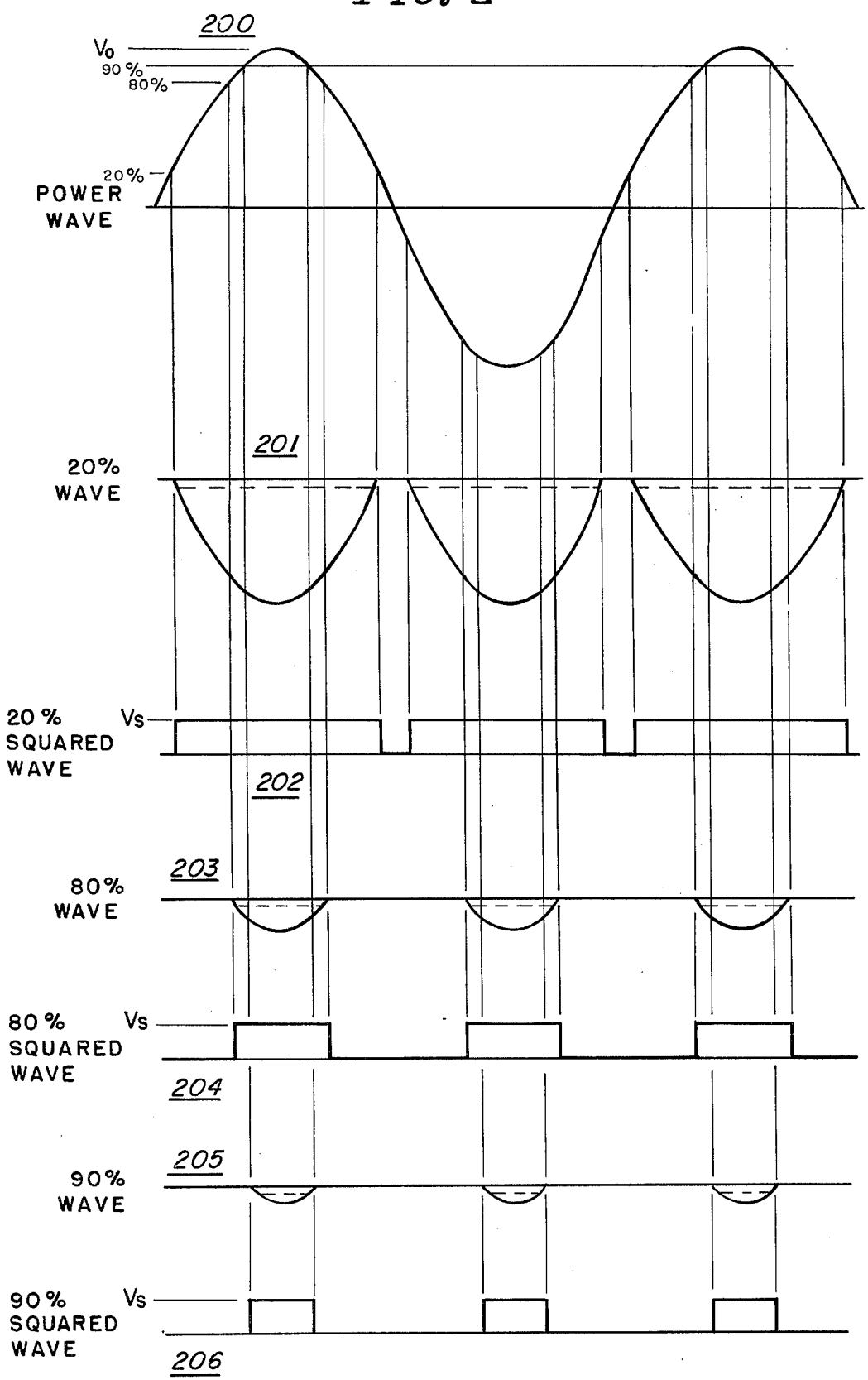
FIG. 2 discloses waveforms associated with the circuit of FIG. 1.

Turning to FIG. 1, transformer 100 has a primary 101 across which AC line power or other AC signal to be analyzed is applied. Secondary 102 in a typical circuit has twice the number of turns as primary 101. In the full-wave configuration shown, this provides a voltage signal at center tap 118 with respect to either end tap 124 or 125 which has exactly the peak-to-ground voltage of the input signal. Anodes of rectifier diodes 103 and 104 are connected to end taps 124 and 125 respectively of secondary 102, and their cathodes are connected to ground providing a full-wave rectification of the input signal waveform across center tap 118 and ground. With the orientation for rectifier diodes 103 and 104 shown, ground will always be positive with respect to center tap 118. Reversing orientation of rectifier diodes 103 and 104 will change this polarity. A cutoff diode 105, connected to be forward biassed by current flow between center tap 118 and ground, supplies the rectified input signal to a string of zener diodes.

The series string of zener diodes 106–109 receives this full-wave signal output at the anode of zener diode 106. To form the zener diode string, the anodes of zener diodes 107, 108, and 109 are connected by conductors 140, 141, and 142 to the cathodes of, respectively zener diodes 106, 107, and 108. Conductor 143 is connected to the cathode of zener 109. The anode of cutoff diode 105 is connected to the anode of zener diode 106, this connection functioning as the diode string input terminal. Conductors 140–143 are connected to ground by return path resistors 110–113, respectively. The voltages appearing across resistors 110–113 upon amplification become the desired voltage level crossing signals.

To perform the amplification of the signals on connectors 140–143, simple high input impedance amplifiers comprising resistors 114–117, zener diodes 120–123, insulated gate field effect transistors 125–128, and pull-up resistors 130–133 are used. Gate resistors 114–117 are connected respectively between conductors 140–143 and the gates of transistors 125–128. If transistors 125–128 are not of the protected gate type, then the cathodes and anodes of gate-protect zener diodes 120–123 are connected to, respectively the gates of transistors 125–128, and ground. One output terminal of each transistor 125–128, either source (S) or drain (D) depending on the particular type of transistor involved, is grounded. Pull-up resistors 130–133 connect the ungrounded signal electrodes of transistors 125–128 respectively to output voltage source Vs. Squared-up relatively low impedance outputs of the type desired, such as waveforms 202, 204, and 206 illustrate, are available at output terminals 135–138.

In explaining the operation of the apparatus of FIG. 1, it is important to understand the function of zener diodes 106–109. For illustrative purposes in explaining the selection of the reverse zener diode drops, assume that transformer 100 has a 1:2 ratio between primary 101 and secondary 102. 120 v. line voltage applied to primary 101 is shown as waveform 200 and is a sine wave having an RMS voltage Vo, resulting in a peak half cycle voltage of $\sqrt{2}Vo$. The line voltage induces a full-wave rectified signal whose peak half cycle voltage is $\sqrt{2}Vo$ between center tap 118 and ground. In actuality, cutoff diode 105 and rectifier diodes 103 and 104 cause two diode drops decrease to the peak voltage applied to the anode of diode 106, but since these drops are relatively small (0.6 v. per diode) relative to the peak half cycle voltage (170 v. for a 120 v. RMS voltage) these two drops can be ignored, or taken into account in the selection of the backward voltage drops in zener diodes 106–109, to be described infra. If diode 105 is omitted, only one diode drop occurs. For purposes of example, the levels at which the desired output signals change have been chosen, as shown, as 20%, 80%, 85%, and 90% of peak voltage $\sqrt{2}Vo$.

The reverse voltage drop characteristics of zener diodes 106–109 are used to produce voltages on conductors 140–143 which remain at zero until the desired voltage threshold has been exceeded, whereupon the voltage on the individual conductor 140–143 with respect to ground precisely follows that portion of the power waveform excursion greater than the threshold. E.g., the voltage at conductor 140 is shown as waveform 201 (positive half cycles inverted due to the full wave rectification) where it can be seen that the waveform in each half cycle precisely follows the top 80% of the corresponding power wave half cycle. Similarly, the voltage at conductors 142 and 143 are shown as wave forms 203 and 205 respectively. This is because diodes 106–109 act to clip or remove the portions of the waveform within the specified percentage of the power wave excursion and DC restore, or shift lower by the specified percentage, the remainder of the waveform, in a near linear fashion. This linear voltage dropping ability is additive; thus the sum of the reverse voltage drops of zener diodes 106–109 must add up to the voltage threshold at which the signal on terminal 138 changes, in the above illustrated instance $\sqrt{2}Vo(90\%)$ of 153 v. Similarly, the sum of the inverse voltage drops of zener diodes 106–108 must equal $\sqrt{2}Vo$ (85%) and that for zener diode 106 and 107 must equal $\sqrt{2}Vo(80\%)$. The reverse voltage drop of zener diode 106 must be $\sqrt{2}Vo(20\%)$. If the forward voltage drops of diodes 103–105 are considered, these values must be reduced by two forward drops of diodes 103–105 which for the common silicon diodes now in use which have a forward drop of 0.6 v. each, is 1.2 v. total. The reverse voltage drop for zener diode 107 must be $\sqrt{2}Vo(60\%)$ or 102 v. which is the voltage drop required from the 20% threshold to the 80% threshold. Similarly, the reverse voltage drops for zener diodes 108 and 109 can be each determined to be $\sqrt{2}Vo(5\%)$, the drop required from 80 to 85% and from 85 to 90%. One important advantage of this circuit is that lower voltage zener diodes can be used when placed in the diode string. The expense of individual zener diodes tends to increase significantly with increased reverse voltage drop, and the employment in such a string results in reduced individual zener voltages. Zener and other breakdown diodes have inherent noise abd parasitic capacitance which cutoff diode 105 reduces. If this can be accomplished in a different way diode 105 can be eliminated, as indicated by jumper 150.

The individual clipped waves shown by wave forms 201, 203, and 205 are not suitable for use in either analog or digital circuitry because of their varying level while the associated voltage threshold is exceeded. Accordingly, the amplifiers provided square up these waves to allow their use in such circuitry. It is possible to employ any high impedance input amplifier which has an appropriately voltage limited output to provide the squared-up signal desired. However, a simpler and less expensive way is shown in FIG. 1 employing insulated gate field effect transistors 125–128 as the amplifying elements. The extremely high input impedances of transistors 125–128 causes negligible voltage drop across return path resistors 114–117. Transistors 125–128 shown are of the N-channel depletion mode type, whose impedance between source (S) and drain (D) is very low when the gate voltage is approximately that at the drain, but increases by several orders of magnitude when gate voltage becomes more than a volt or so more negative than that on the drain. Thus, as the voltage on any one of the conductors 140–143 starts dropping below 0 v., source-to-drain impedance of the associated transistor 125–128 increases and the voltage at the associated output terminal 135–138 increases from approximately 0 v. to approximately that of Vs. To prevent imposing too great a voltage on the gate of any of transistors 125–128, zener diodes 120–123 protect these transistors' gates from excessive voltage difference. Typical values for diodes 120–123 can be from 1 v. to 4 v. If transistors 125–128 are of the gate-protected type, diodes 120–123 can be omitted.

Thus in operation, as each negative-going half cycle in waveforms 201, 203, and 205 goes negative, the voltage on terminals 135–138 rises to voltage Vs as shown in wave forms 202, 204, and 206 (for output terminals 135, 136, and 138) respectively. The effect of zener diodes 120–123 is represented by the dotted lines in wave forms 201, 203, and 205, and correspond to the backward voltage drops in these diodes which cause the voltage on transistor 125–128 gates to follow these dotted lines. Excessive current through zener diodes 120–123 is prevented by resistors 114–117.

Several variations on the operation of this circuit are possible. By reversing the polarity of all diodes in the circuit, the circuit can be made to produce positive-going clipped pulses on conductors 140–143. Such a change necessitates choosing a P channel type for field effect transistors 125–128, and making Vs negative, thereby producing negative output signals. Also, the voltage drops of the breakdown diodes must be reselected. By selecting from the choices available for enhancement or depletion mode and N channel or P channel transistors, the output as exemplified by wave forms 202, 204 and 206 can be made positive-going or negative-going at the leading edge of each clipped half cycle to provide an output compatible with any of the various types of digital logic elements. Four-layer diodes or gas tubes can be used in place of zener diodes 106–109. In FIG. 1, the >> symbols in the lines connecting four-layer diode 108a and gas tube 108b into the circuit imply that either circuit element may replace zener diode 108. Because of their symmetrical design the orientation of four-layer diodes is immaterial. It is of cource possible to employ a half-wave rectifier if checking only positive or negative half cycles of the input waveform is sufficient. In fact, no rectifier at all need be used if the voltage swings across return path resistors 114–117 while zeners 106–109 are formed biassed are ignored by the circuitry receiving these voltages. If symmetrical breakdown devices are employed, then the resistor voltage will change from 0 at the proper times, but will of course swing positive and negative on corresponding AC half cycles. These resistor voltages can be rectified. However, it is generally desirable to perform a single rectification of the input signal instead. Use of a bridge rectifier can obviate the necessity for transformer 100, although the isolation and spike filtering provided by the transformer is very useful. The specified 1:2 turns ratio for transformer 100 can be arbitrarily varied within fairly wide limits without affecting the operation of the circuit as long as the reverse voltage drops in diodes 106–109 are changed to provide the same percentage of peak voltage for the desired clipping levels. However, to avoid slow device breakdown, fairly large input voltages are preferred. The preceding describes the invention.

What is claimed is:

1. A circuit for providing first through $n$th, $n$ at least 2, output signals, each changing responsive to the crossing of an associated predetermined voltage level by a varying input signal appearing across first and second input signal terminals, the first at times more positive than the second and comprising:
    a. first through $n$th breakdown devices each having a preselected voltage drop from a first to a second terminal;
    b. a zeroeth connector connecting one terminal of the first breakdown device to the input signal terminal having the same ordinal designation;
    c. first through $n-1$th connectors connecting the first through $n$th devices in a series string in ascending ordinal designation, each of the first through $n-1$th connectors respectively connecting terminals of opposite ordinal designation on devices having the same and one greater ordinal designations, and the first connector connected to the first device's terminal which is not connected to the signal terminal; and
    d. first through $n$th return path resistors, all having a first terminal connected to the input signal terminal which is not connected to the first breakdown device, the first through $n-1$th having their second terminal connected respectively to the first through $n-1$th connectors, and the $n$th having its second terminal connected to that terminal of the $n$th breakdown device which is not connected to the $n-1$th connector;
wherein the preselected breakdown device voltage drops are selected such that the sum of the voltage drops between the zeroeth and $i$th connectors substantially equals the predetermined voltage level associated with the $i$th output signal, and wherein the first through $n$th output signals appear respectively across the first through $n$th return path resistors.

2. The circuit of claim 1, wherein the breakdown devices are four-layer diodes.

3. The circuit of claim 1, wherein the breakdown devices are gas tubes.

4. The circuit of claim 1, wherein the breakdown devices are zener diodes.

5. The circuit of claim 4, further comprising a cutoff diode interposed between the first zener diode and the zeroeth connector, and oriented to be forward biased by the current flow through the zeroeth connector when the first input signal terminal is more positive than the second.

6. The circuit of claim 5, wherein the first input terminal is always more positive than the second, and the zeroeth connector is connected to the first input signal terminal.

7. The circuit of claim 5, wherein the second input terminal is always more positive than the first, and the zeroeth connector is connected to the second input signal terminal.

8. The circuit of claim 5, including a rectifier receiving an AC signal, and supplying the rectified AC signal to the input signal terminals.

9. The circuit of claim 8, wherein the rectifier comprises a transformer coupled full-wave rectifier.

10. The circuit of claim 9, further comprising first through $n$th amplifiers having similar response times and, supplying the first through $n$th output signals respectively, with the inputs of each connected across the return path resistor having that amplifier's ordinal designation.

11. The circuit of claim 10, wherein each amplifier comprises an insulated gate field effect transistor receiving the output signal.

12. The circuit of claim 11, wherein the rectifier comprises
    a. transformer having a primary winding receiving the input signal and a secondary winding having twice the total turns of the primary, first and second end taps, and a center tap supplying the input signal to the cutoff diode; and
    b. first and second rectifier diodes each having the electrode matching the zener diodes' second electrode connected to the first and second end taps, respectively of the secondary, and the other terminal of each of the second terminals of the return path resistors.

13. The circuit of claim 12 wherein the cutoff diode connects the secondary center tap to the first zener diode, electrodes of the cutoff diode and the zener diode connected to each other matching.

14. The circuit of claim 1, further comprising a cutoff diode interposed between the first breakdown device and the zeroeth connector, and oriented to be forward biased by current flow through the zeroeth conductor when the first input signal terminal is more positive than the second.

15. The circuit of claim 14, further comprising a full-wave rectifier receiving an AC signal and supplying the rectified AC signal to the input signal terminals.

16. The circuit of claim 15, further comprising first through $n$th similar high input impedance amplifiers supplying the first through $n$th output signals respectively, with the inputs of each connected across the return path resistor with that amplifier's ordinal designation.

* * * * *